United States Patent
Crippen et al.

(10) Patent No.: US 7,735,326 B2
(45) Date of Patent: *Jun. 15, 2010

(54) AIR RE-COOL FOR ELECTRONIC EQUIPMENT

(75) Inventors: Martin Joseph Crippen, Apex, NC (US); Albert Vincent Makley, Raleigh, NC (US); Jason Aaron Matteson, Raleigh, NC (US); William Joseph Piazza, Holly Springs, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/173,351

(22) Filed: Jul. 15, 2008

(65) Prior Publication Data

US 2008/0271464 A1 Nov. 6, 2008

Related U.S. Application Data

(63) Continuation of application No. 11/530,284, filed on Sep. 8, 2006.

(51) Int. Cl.
*F25B 21/02* (2006.01)
(52) U.S. Cl. ....................... 62/3.2; 62/259.2
(58) Field of Classification Search .................. 62/3.2, 62/3.7, 259.2, 87, 401
See application file for complete search history.

(56) References Cited

U.S. PATENT DOCUMENTS

| | | | |
|---|---|---|---|
| 5,934,079 A | 8/1999 | Han et al. | |
| 6,058,712 A | 5/2000 | Rajasubramanian et al. | |
| 6,118,654 A | 9/2000 | Bhatia | |
| 6,298,669 B1 | 10/2001 | Maruyama et al. | |
| 6,351,951 B1 | 3/2002 | Guo et al. | |
| 6,434,001 B1 | 8/2002 | Bhatia | |
| 6,705,089 B2 | 3/2004 | Chu et al. | |
| 7,134,288 B2 * | 11/2006 | Crippen et al. ............... | 62/3.2 |
| 2005/0247067 A1 | 11/2005 | Crippen et al. | |
| 2008/0060363 A1 * | 3/2008 | Crippen et al. ............... | 62/3.2 |

* cited by examiner

*Primary Examiner*—Melvin Jones
(74) *Attorney, Agent, or Firm*—Cynthia G. Seal; Jeffrey L. Streets (57) ABSTRACT

Embodiments include systems and methods for selectively cooling heat-generating electronic components in an enclosure. According to one embodiment, an enclosure houses a plurality of heat-generating electronic components. Air enters the enclosure at the front and is exhausted at the rear. After passing through one or more upstream components, air diverges into at least first and second airstreams within the enclosure. The first airstream is re-cooled by a cooling system having a thermoelectric cooling module. The thermoelectric cooling module is configured such that a first side is cooled and a second side is heated in response to an applied voltage. A voltage regulator may govern the voltage in response to one or more temperatures sensed within the rack system.

19 Claims, 6 Drawing Sheets

AIR RE-COOL FOR ELECTRONIC EQUIPMENT

CROSS-REFERENCE TO RELATED APPLICATIONS

This application is a continuation of and claims priority to co-pending U.S. patent application Ser. No. 11/530,284, filed on Sep. 8, 2006.

BACKGROUND OF THE INVENTION

1. Field of the Invention

The present invention relates to cooling systems for enclosures housing multiple heat-generating electronic components.

2. Description of the Related Art

Computer systems typically include multiple heat-generating electronic components housed in an enclosure. Excessive heat can shorten component lives, so heat must be continually removed from an enclosure to prevent the components from reaching elevated temperatures. In nearly all significant computer installations, the amount of heat that must be removed requires the use of forced convection across or through each of the heat-generating components. Accordingly, the cabinets, chassis and individual components are generally designed to accommodate the forced flow of air through air pathways in or between the components.

An enclosure typically has closed top, bottom, and sides, so that the net airflow is from the front to the rear of the enclosure. Thus, downstream components typically must be cooled by air that has already passed across or through upstream components. For example, in IBM's BLADECENTER chassis (IBM and BLADECENTER are registered trademarks of International Business Machines Corporation, Armonk, N.Y.), air typically enters the chassis or enclosure through multiple server blades and later passes through network switch modules, management modules, and power modules before being drawn through blowers and expelled from the enclosure. The server blades may heat air to as high as 54° C. before the heated air reaches the downstream subsystems toward the rear of the enclosure. As blade and processor technology continues to advance, the operating temperatures of processors and other components will likely increase too. An increase in upstream temperatures may further constrain the downstream modules, making proper cooling even more critical.

One way to help ensure proper cooling of electronic equipment is to increase air flow. However, there are practical limitations on how fast air can be blown through an enclosure. Increased air flow can also lead to other problems, such as increased noise and increased build-up of dust and other contaminants. Another solution to avoid overheating is to design the network switches, power modules, and other downstream components and subsystems to withstand hotter temperatures. Alternatively, limitations may need to be imposed upon the number of server blades supported by the enclosure. Each of these possible solutions has inherent practical limitations.

What is needed is an improved way to cool electronic equipment. In particular, what is need is a better way to cool downstream subsystems that receive pre-heated air. It would be desirable to achieve improved cooling of downstream components without appreciably changing existing constraints. It would be further desirable to improve cooling performance to accommodate future increases in processor speed and power, and to allow for larger numbers of servers within an enclosure.

SUMMARY OF THE INVENTION

The present invention includes cooling systems and methods for cooling electronic equipment. In a first embodiment, a cooling system for electronic equipment includes an enclosure housing a plurality of heat-generating electronic components. The enclosure has an enclosure inlet for receiving air and an enclosure outlet for exhausting heated air. A first air pathway and a second air pathway separated by a distance within the enclosure. A thermoelectric cooling module is configured such that a first side is cooled and a second side is heated in response to an applied voltage. A first heat exchanger is disposed in the first air pathway and in thermal contact with the first side of the thermoelectric cooling module. A second heat exchanger is disposed in the second air pathway and in thermal contact with the second side of the thermoelectric cooling module.

In a second embodiment, a method includes the step of conveying air through an enclosure that houses one or more heat-generating components. Heated air is separated into at least first and second parallel airstreams within the enclosure. The first airstream is passed through a first heat exchanger in thermal contact with a first side of a thermoelectric cooling module. The second airstream is passed through a second heat exchanger in thermal contact with a second side of the thermoelectric cooling module. A voltage is applied to the thermoelectric cooling module to cool the first side and heat the second side of the thermoelectric cooling module.

In a third embodiment, a cooling system for electronic equipment includes an enclosure housing a plurality of heat-generating electronic components. The enclosure has an enclosure inlet for receiving air and an enclosure outlet for exhausting heated air. A first air pathway and a second air pathway are separated by a distance within the enclosure. A thermoelectric cooling module is configured such that a first side is cooled and a second side is heated in response to an applied voltage. A first heat exchanger is disposed in the first air pathway and in thermal contact with the first side of the thermoelectric cooling module. A second heat exchanger is disposed in the second air pathway and in thermal contact with the second side of the thermoelectric cooling module. A controller is in electrical communication with the thermoelectric cooling module. A machine-accessible medium is in communication with the controller. The machine-accessible medium contains instructions, which when executed by the controller, cause the controller to apply a voltage to the thermoelectric cooling module to cool the first side and heat the second side of the thermoelectric cooling module.

DETAILED DESCRIPTION OF PREFERRED EMBODIMENTS

The invention encompasses systems and methods for cooling electronic equipment within an enclosure. The invention makes use of localized cooling induced by applying a voltage to a junction of two dissimilar metals. This cooling is often referred to as the Peltier effect. A thermoelectric cooling module ("TEC") is a solid state device that uses an applied voltage to induce cooling. A TEC typically includes hundreds of junctions, which are electrically in series and thermally in parallel. The net effect of an applied voltage is to cool one side of the TEC and heat an opposing side of the TEC.

In one embodiment, air is pre-heated by upstream, heat-generating electronic components as a result of thermal contact with these components before reaching downstream subsystems. The downstream subsystems may include one or more other heat-generating electronic components. A thermoelectric cooling module (TEC) is configured with heat pipes and other heat exchanger elements to extract heat from the air before it enters the downstream subsystems. The extracted heat may be transferred directly to another air stream. While not greatly affecting the final exhaust temperature of the enclosure, the system desirably causes localized cooling within a selected portion of the enclosure. The air stream to which the extracted heat is transferred may be routed past or through other components within the enclosure that are less sensitive to heat. The embodiments discussed include systems and methods for cooling rack-mounted server systems. However, the invention is also useful with a wide variety of other electronic equipment. Therefore, the scope of the invention is not limited to cooling rack-mounted server systems. Still, it should be recognized that the heat generated by the electronic components is an undesirable effect of electrical resistance through the components and the heat itself is not generated to serve a particular purpose.

Figure 1:
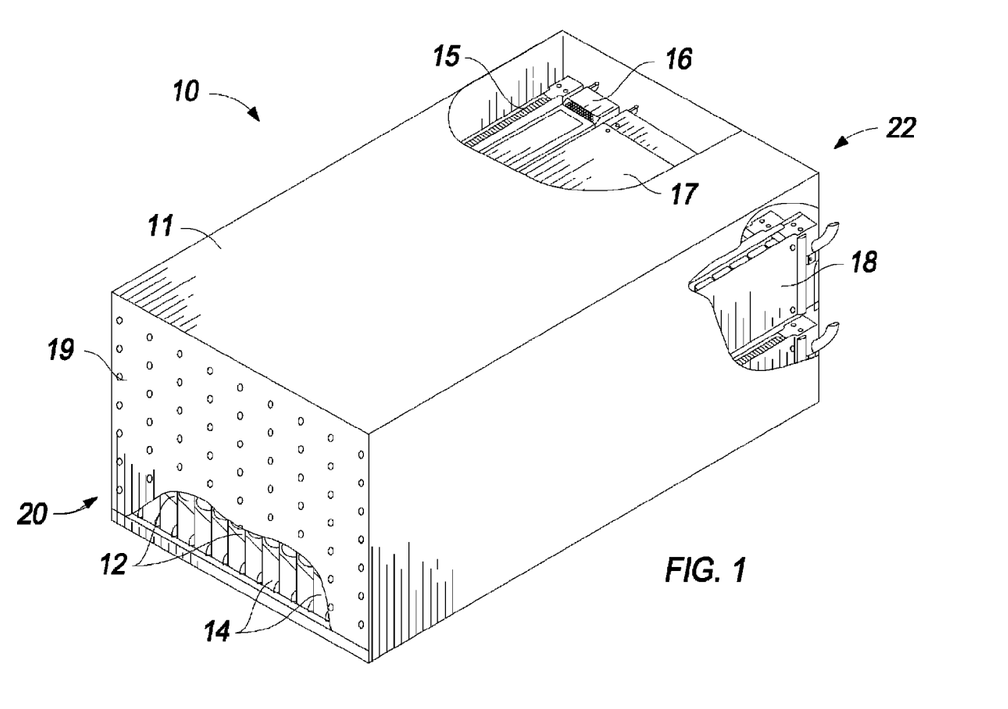
FIG. 1 is a partially cutaway perspective view of a computer system that may be configured with a cooling system according to the invention.

FIG. 1 is a partially cutaway perspective view of one embodiment of a computer system 10 that may be configured with a cooling system according to the invention. Due to the wide range of rack systems that may benefit from the invention, the computer system 10 is not intended to designate any particular make, model, or variety. The computer system 10 includes an enclosure 11 housing multiple servers 12 and intake vents 14. The servers 12 may include single or multi-processor servers having, for example, hard drives and memory to service one or more common or independent networks. Optionally, the servers 12 may be hot-swappable blade servers. The enclosure 11 also houses many other components, such as a management controller module 15, a power module 16, a blower 17, and a switch module 18. The multiple servers 12 may share the management controller 15, power module 16, blower 17, and switch module 18, and other support modules housed within the enclosure 11. In many embodiments, connectors may couple the servers 12 with the support modules to reduce wiring requirements and facilitate installation and removal of the servers 12. For instance, each server 12 may couple with a gigabit Ethernet network via the switch module 18. The enclosure 11 may couple the servers 12 to the Ethernet network without connecting individual cables directly to each server. The enclosure 11 includes an optional grillwork 19.

The net airflow in the computer system 10 is from the front 20 to the rear 22 of the enclosure 11, although the invention may be implemented in enclosures having other net airflow patterns. The blower 17 facilitates forced air convection to remove heat produced by the components within the computer system 10. The blower 17 draws air into the front 20 of the enclosure 11, through the servers 12, through various downstream components such as the support modules, and exhausts the air at the rear 22 of the enclosure 11, where the air mixes with ambient air. The air is heated as it travels from the front 20 of the enclosure 11 and through the servers 17. The air is further heated as it successively passes through the downstream components.

Figure 2:
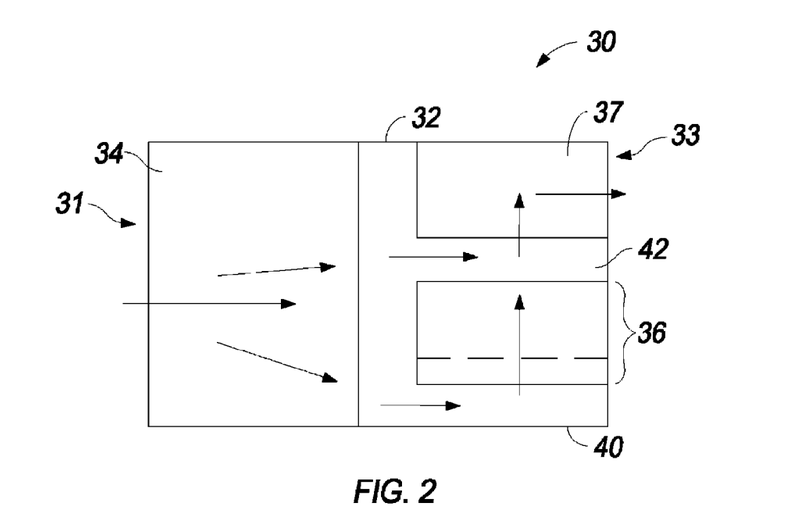
FIG. 2 is a schematic plan view illustrating airflow within a portion of a computer system.

FIG. 2 is a schematic plan view illustrating airflow within a portion of a BLADECENTER-like rack system 30. The rack system 30 includes an enclosure 32 housing at least one server blade 34. The server blade 34 may include one or more CPUs, memory, support, I/O chips, DASD, and so forth. A subsystem to be cooled is generally indicated at 36. Dashed lines indicate that multiple electronic components may be included with the subsystem 36, although the subsystem 36 could include as few as one electronic component to be cooled. The inlet to the subsystem 36 is the location or region that air contacts the subsystem 36, regardless of whether air actually flows into, through, and/or across an external surface of the component(s) of the subsystem 36. Likewise, the outlet to the subsystem 36 is the location or region that air first leaves the subsystem 36, regardless of whether air actually flows out of, through, and/or across an external surface of the component(s) of the subsystem 36.

A blower 37 drives air convection from the front 31 to the rear 33 of the enclosure 32. As air is driven through the enclosure 32 it may follow a variety of pathways, as indicated in the figure by arrows. For example, air may travel through components, between components, and along plenums optionally included in the rack system 30. Air entering the front 31 of the enclosure 32 passes through the server blade 34 where the air absorbs heat, and may therefore be said to be "pre-heated" with respect to downstream components. The pre-heated air diverges to follow different pathways after exiting the blade 34. Along one route, air exiting the blade 34 travels through a first plenum 40 and through the subsystem 36 before crossing a second plenum 42 to the blower 37. Along another route, air exiting the blade 34 travels through the second plenum 42 more directly to the blower 37, bypassing the subsystem 36, before reaching the blower 37. Regardless of the pathways it takes, air eventually exits the rear 33 of the enclosure 32, after which it is typically free to mix with ambient air. The handling of exhaust air in computer rooms is well known in the art and is not considered part of the present invention.

Different levels of heating typically occur at different locations throughout the enclosure 32. Air is typically progressively heated as it travels through the enclosure 32. For example, air is first heated as it travels through the blade 34 and is further heated as it travels through the subsystem 36. Embodiments of the invention may be used to selectively cool the pre-heated air using a thermoelectric cooling device (TEC) to transfer heat to another, parallel airstream before it enters the subsystem 36, to more effectively cool components of the subsystem 36 and to minimize the risk of overheating.

Alternatively, a component may be directly cooled by placing the component in thermal contact with a TEC and transferring the heat to an airstream at a distance from the component.

Figure 3:
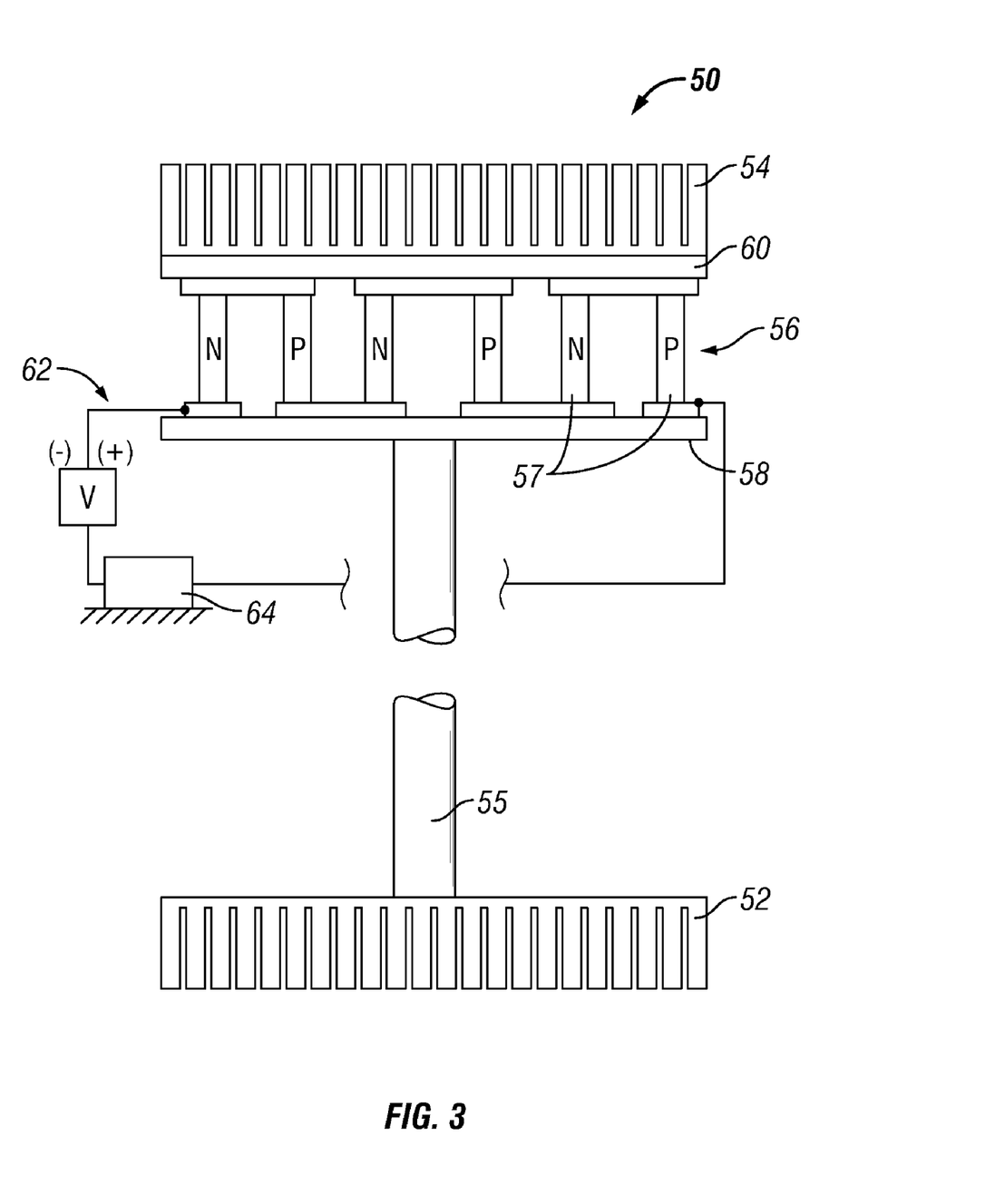
FIG. 3 is a schematic diagram of one embodiment of a cooling system according to the invention.

FIG. 3 is a schematic diagram of one embodiment of a cooling system 50 according to the invention. A thermoelectric cooling module (TEC) 56 includes a first plate 58 and an opposing second plate 60. An array of "P" and "N" members 57 are sandwiched between the first and second plates 58, 60. The P and N materials in this embodiment are P-doped telluride pellets and N-doped telluride pellets. The telluride pellets are bulk semiconductors, and there are no P/N junctions. The array of P and N materials are also not to be confused with diodes. The TEC 56 having alternating P and N materials is just one example, and other configurations of TECs operating according to the Peltier effect are known to those of ordinary skill in the art.

An electrical circuit is constructed that includes a voltage source 62 electrically coupled with the TEC 56. A controller or voltage regulator 64 controls the voltage source 62. A first heat exchanger includes at least one heat pipe 55 or some other high efficiency heat conduction medium in thermal communication at one end to the first plate 58 and at another end to a first heat sink 52. Preferably, the thermal communication is made through direct contact, such as by mechanically coupling. A second heat exchanger includes a heat sink 54 in thermal communication to the second plate 60. A thermal grease or other conductive medium may be applied to the junction between the first plate 58 and the heat pipe 55 and between the heat pipe 55 and the first heat sink 52, and between the second heat sink 54 and the second plate 60.

According to the Peltier effect, applying one polarity of a voltage to the TEC 56 causes a cooling of the first plate 58 and a corresponding heating of the opposing second plate 60. Reversing the polarity of voltage applied to the TEC 56 would reverse the direction of heat transfer within the first and second heat exchangers, which is generally undesirable in this embodiment. As the first plate 58 of the TEC 56 is cooled to a temperature below that of the first heat sink 52, heat is transferred along the heat pipe 65 from the first heat sink 52 to the first plate 58. Similarly, as the second plate 60 of the TEC 56 heats up, heat is transferred from the second plate 60 to the second heat sink 54. The voltage regulator 64 may selectively control the voltage source 62 to control cooling/heating of the TEC 56. For example, increasing the voltage may increase the rate of heat transfer in the first and second heat exchangers. The voltage regulator 64 may physically reside within the enclosure 32 (FIG. 2), and may include one or more processors of the rack system 30. Different arrangements and configurations may be provided for the heat sinks 52, 54, the heat pipe(s) 55 (if any), and any additional heat sinks or heat transfer members with which the cooling system 50 is configured, as will be better understood in connection with the embodiments discussed below.

Figure 4:
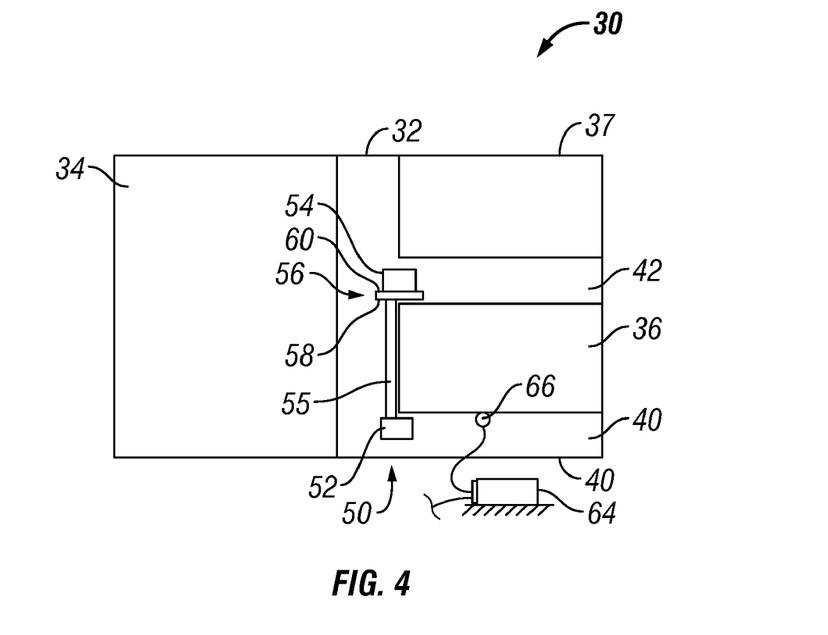
FIG. 4 is a schematic diagram showing the cooling system of FIG. 3 configured with the computer system of FIG. 2 to selectively cool air before it enters the subsystem.

FIG. 4 is a schematic diagram showing the cooling system 50 of FIG. 3 configured with the rack system 30 of FIG. 2 to selectively cool air before entering the subsystem 36. The first heat sink 52 is disposed in the first plenum 40, and the second heat sink 54 is disposed in the second plenum 42. As described in connection with FIG. 3, applying a voltage to the TEC 56 transfers heat from the first heat sink 52 to the second heat sink 54. Thus, the cooling system 50 extracts heat from that portion of the pre-heated air passing from the blade 34 to the first plenum 40. More specifically, in this particular embodiment, sufficient voltage is applied to the TEC 56 to cool the first plate 58 to a temperature below that of air entering the first plenum 40. Heat is thereby transferred from the pre-heated air entering the first plenum 40 to the first heat sink 52; from the first heat sink 52 to the heat pipe 55; along the heat pipe 55 toward the cooled first plate 58 of the TEC 56 (FIG. 3); across the TEC 56 to the second plate 60; from the second plate 60 to the second heat sink 54; and from the second heat sink 54 to the airstream flowing through the second plenum 42.

Extracting heat from the airstream in the first plenum 40 desirably reduces an inlet temperature to the subsystem 36. The air cooled by the cooling system 50 is used to cool the subsystem 36, then transferred to the second plenum 42, where the subsystem exhaust air mixes with another airstream traveling more directly from the blade 34 to the second plenum 42. However, air traveling through the second plenum 42 is routed directly to the blower. Thus, the extracted heat effectively bypasses the subsystem 36, which may include electronic components that are more prone to damage or failure due to increased temperatures. The blower, by contrast, is typically better able to withstand higher temperatures. Similarly, in other embodiments, a system designer may configure a cooling system to transfer heat from a first airstream to one or more other airstreams, which may diverge in parallel to one another. The system designer may thereby control, to at least some extent, the air temperatures to which one or more various subsystems will be exposed within a system of multiple electronic components. The net temperature of air exiting an enclosure will typically be no lower than without the use of the TECs. Depending on the level of efficiency of the TEC(s), the net temperature may actually increase. More importantly, however, embodiments of the invention produce desired localized cooling of air flow directed at or towards components that are more prone to heat failure, while transferring heat to air flow directed at or towards more robust or heat-resistant components. Thus, the rack system or other electronic equipment to which the invention is applied may, as a whole, operate more reliably.

The system designer may further control the voltage supplied to one or more TECs, or the system designer may program a controller or voltage regulator to automatically adjust the voltage to the TEC according to the desired degree of cooling. FIG. 4 schematically shows a temperature sensor 66 positioned relative to the air inlet to the subsystem 36 to be cooled and configured with the voltage regulator 64. The temperature sensor 66 senses a temperature and outputs a signal representative of the temperature to the voltage regulator 64. The voltage regulator 64 may control the voltage applied to the TEC 56 according to the sensed temperature. For example, the voltage regulator may turn the TEC 56 "ON" in response to the temperature reaching a set point, which may be predetermined by the user or system designer. The voltage regulator 64 may turn the TEC 56 "OFF" in situations wherein temperatures sensed by the temperature sensor 66 are relatively low, such as may occur when the rack system 30 is in an environment having a relatively low ambient air temperature. Alternatively, the voltage regulator 64 may control the level of the voltage applied to the TEC 56, so that higher levels of cooling occur in response to higher temperatures sensed by the temperature sensor 66, and lower levels of cooling occur in response to lower temperatures sensed by the temperature sensor 66. Optimization of the voltage control, whether through duty cycles or voltage level control, may be carried out by a system designer.

Figure 5A:
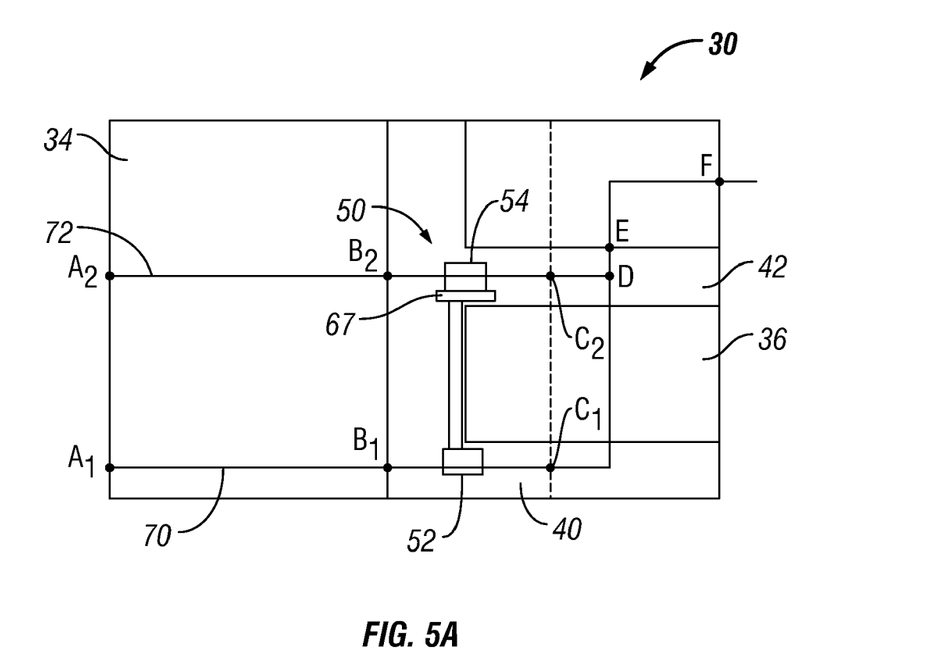
FIG. 5A is a schematic diagram of the computer system and cooling system of FIG. 4 labeled at different locations throughout the computer system.
Figure 5B:
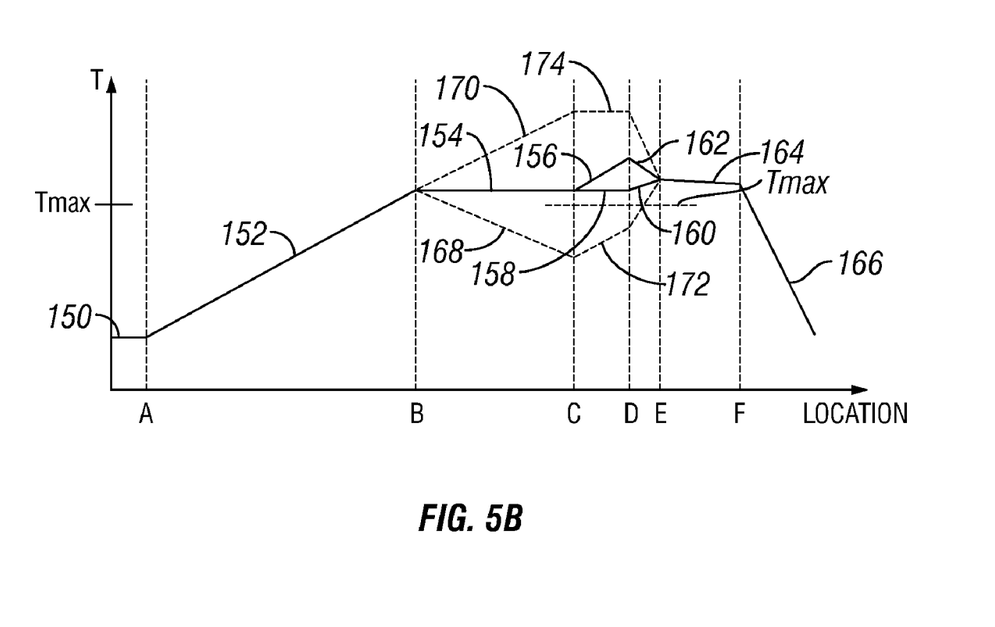
FIG. 5B is a graph of a theoretical temperature profile according to the locations labeled in FIG. 5A.

FIG. 5A is a schematic diagram of the rack system 30 showing a first airstream 70 labeled at various locations A1 through F, and a second airstream 72 labeled at various locations A2 through F. The two airstreams 70, 72 are generally parallel until they first meet at a point D, at which they converge prior to exiting the enclosure 30. The airstreams 70,

72 are simplified for illustration purposes, but may be considered representative of any number of generally parallel air streams or generally parallel portions of the same air stream. For example, it is assumed that no mixing of the airstreams 70, 72 occurs prior to point D, even though, in practice, mixing may occur throughout the second plenum 42. FIG. 5B, which may be viewed together with FIG. 5A, plots temperature profiles for the airstreams 70, 72 with reference to the various points shown in FIG. 5A. FIG. 5B is also simplified for illustration purposes. For example, the distances between points in FIG. 5B are not intended to be equal to distances between corresponding points in FIG. 5A. Furthermore, FIGS. 5A and 5B generally assume a perfectly efficient system, with no net heat generated by the TEC.

Heating patterns in the enclosure 30 both with and without the effects of the cooling system 50 (i.e., with the TEC 67 ON or OFF) may be compared with reference to FIGS. 5A and 5B together. The examples that follow assume that a certain critical temperature Tmax has been specified for the subsystem 36, above which the subsystem 36 may overheat. As will be shown, the subsystem 36 may undesirably exceed Tmax without the benefit of the cooling system 50. With the assistance of the cooling system 50, however, the temperature of the subsystem 36 may desirably be maintained below Tmax.

The heating pattern will first be examined as though the TEC 67 were OFF. Ambient air enters the enclosure 30 at points A1 and A2, at substantially the same temperature, indicated by horizontal segment 150 in FIG. 5B. Air is heated by the blade 34 at substantially the same rate between points A1 and B1, A2 and B2, as indicated by an inclined segment 152. There is substantially no temperature change from points B1 to C1 or B2 to C2, as indicated by a horizontal segment 154. From point C1 to D, the first airstream 70 is heated by the subsystem 36, indicated by an inclined segment 156. Meanwhile, substantially no heating occurs in the second airstream 72 between points C2 and D, indicated by a horizontal segment 158. From point D to point E, the first and second airstreams 70 and 72 converge and mix. Thus, the temperature of the first airstream 70 increases, indicated by an inclined segment 160, and the temperature of the second airstream 72 decreases, indicated by a declined segment 162, until they reach the same temperature at point E, which is at the entrance to the blower 37. The temperature of the now combined airstreams 70, 72 is higher at E than the temperature at point C, due to the net addition of heat from the subsystem 36. The temperature is shown to remain substantially constant as it passes through the blower 37. In reality, the air temperature may increase through the blower 37 due to compression by fan blades, or it may decrease through the blower 37 due to expansion, depending in part on the characteristics of the blower. Beyond point F, the air may be free to expand, re-mix with ambient air, cooling as shown by the declined segment 166.

The heating patterns in the enclosure 30 will now be examined as though the TEC 67 were ON. Heating patterns in the airstreams 70, 72 are substantially the same up to points B1 and B2 as if the TEC 67 were OFF, which is indicated by the segments 150, 152. At point B in the graph, the temperature undesirably exceeds Tmax, for example, and the cooling system 50 is needed to reduce the temperature of the first airstream 70 below Tmax prior to entering the subsystem 36. Desirably, heat is extracted from the first plenum 40, as discussed with reference to FIG. 4, and the first airstream 70 is cooled to well below Tmax as it passes over the first heat sink 52 between points B1 and C1. This is indicated by the declined line segment 168 in FIG. 5B. Meanwhile, the extracted heat from the first plenum 40 is transferred to the second plenum 42, so that the second airstream 72 is correspondingly heated by the second heat sink 54 between points B2 and C2. This is indicated by the inclined line segment 170. The first airstream 70 is then heated by the subsystem 36 between points C1 and D, as indicated by the inclined segment 172. However, the final temperature of the first airstream 70 at point D is still less than Tmax, as desired. The temperature of the second airstream 72 remains substantially constant between points C and D, indicated by a segment 174. Then, the first and second airstreams 70, 72 start mixing at point D. The temperature of the first airstream 70 rises while the temperature of the second airstream 72 falls until they are fully mixed and reach substantially the same temperature at point E. Because this simplified analysis assumes that the TEC 67 has 100% efficiency, no net heat was added by the cooling system 50, and the temperature at point E is therefore the same as it was with the TEC 67 OFF. Beyond point E, the heating patterns are substantially the same as with the cooling system OFF, as indicated by shared segments 164 and 166.

Figure 6:
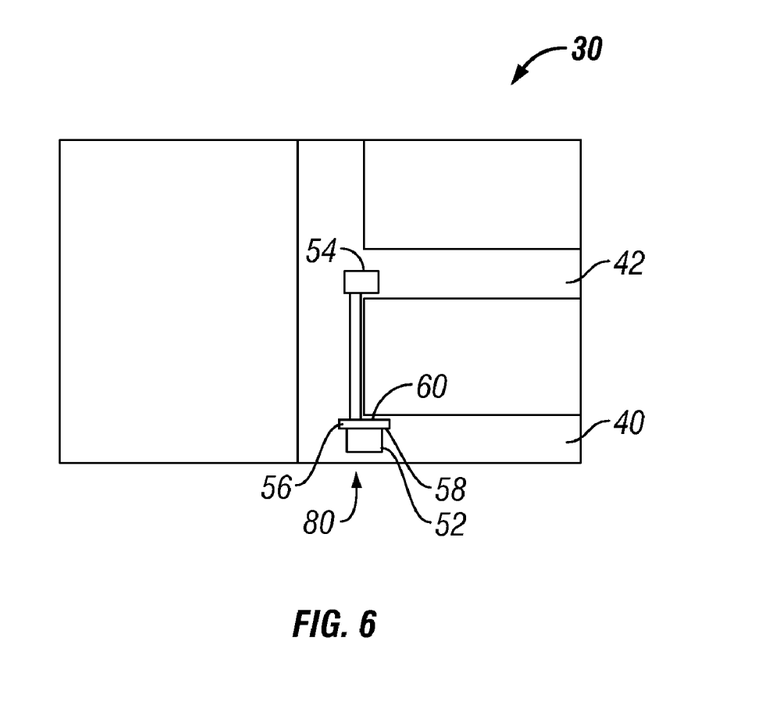
FIG. 6 is a schematic diagram an alternative embodiment of a cooling system disposed in the computer system.

FIG. 6 shows an alternative embodiment of a cooling system 80 disposed in the rack system 30. The TEC 56 is disposed in the first plenum 40, rather than in the second plenum 42. The first heat sink 52 is still disposed in the first plenum 40, and the second heat sink 54 is still disposed in the second plenum 42. However, the first heat sink 52 is directly coupled (or at least in close proximity) to the first plate 58 of the TEC 56, and the heat pipe 55 is coupled at one end to the second plate 60 of the TEC 56 and at the other end to the second heat sink 54. A voltage applied to the TEC 56 has the same polarity as in the embodiment of FIGS. 4-5B, so that the first plate 58 is cooled and the second plate 60 is heated in response to the applied voltage. One skilled in the art will appreciate that other configurations, positions, orientations, and locations of the TEC and other elements of the cooling system 50 may be devised according to the invention. Additionally, other types of heat transfer members, in addition to heat pipes and heat sinks, may be coupled to a TEC for extracting heat from one airstream and transferring it to another, parallel airstream.

The embodiment of FIG. 6 illustrates just one additional example of a configuration of a cooling system for transferring heat between parallel airstreams that may be achieved according to the invention. One skilled in the art having benefit of this disclosure may construct configurations other than those shown in the above embodiments. One may apply the teachings of this disclosure on a case-by-case basis, according to the specific configuration of a rack system in which a cooling system according to the invention is to be implemented. Furthermore, it should be recognized that the invention encompasses both the modification of conventional enclosures and electronic equipment designs, as well as the design of new enclosures and electronic equipment configurations. For example, one may improve an existing rack server system by identifying parallel air pathways within the existing system, and using the principles of the invention to strategically transfer heat from one of the parallel airstreams to another. Alternatively, one may construct a rack server system from scratch, strategically devising parallel air pathways between which heat may be transferred according to the teachings of this disclosure.

Figure 7:
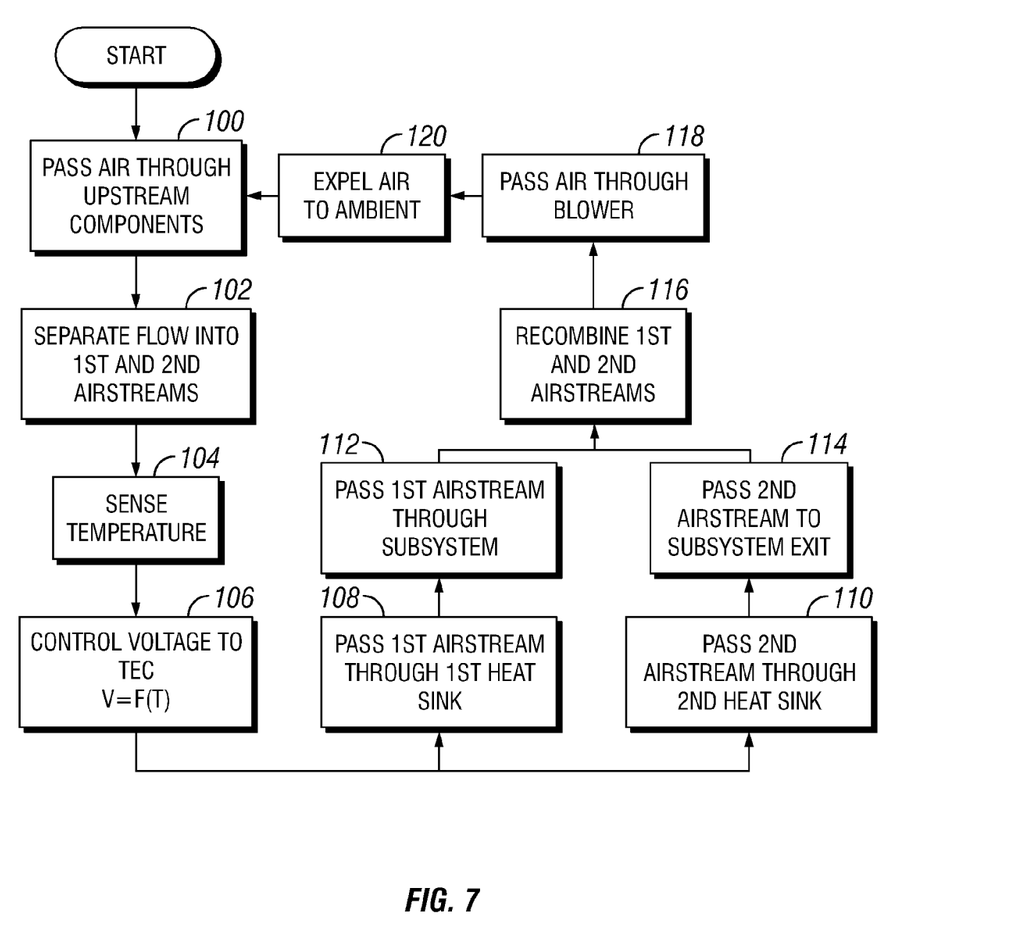
FIG. 7 is a flowchart illustrating one embodiment of a method of cooling a computer system according to the invention.

FIG. 7 is a flowchart illustrating one embodiment of a method of cooling a rack system according to the invention. In step 100, air enters an enclosure and passes through one or more upstream components, such as server blades, where the air is heated. After exiting the upstream components, the airflow separates into at least first and second parallel airstreams in step 102. A first airstream passes through a first heat sink (step 108) and a second airstream passes through a second heat sink (step 110). Meanwhile, a voltage is applied to a TEC to cool a first surface coupled to the first heat sink and to correspondingly heat a second surface coupled to the second heat sink. According to step 106, the voltage to the TEC may be controlled to vary the degree of cooling. In optional step 104, one or more temperatures are sensed within the rack system. For example, the voltage may be increased to increase cooling if temperatures near the inlet of a component to be cooled approach Tmax, above which the component may otherwise be damaged. Heat is effectively extracted from the first airstream and transferred to the second airstream in steps 108 and 110. Thus, the first airstream is cooled when it passes through the first heat sink (step 108), and the second airstream is heated as it passes through the second heat sink (step 110). In step 112, after being cooled by the first heat sink, the first airstream is passed through a subsystem having one or more heat-generating electronic components, to cool the subsystem. In step 114, the second airstream is passed to an exit of the subsystem, where heated air in the second airstream recombines with air in the first airstream according to step 116. The recombined air then passes through the blower in step 118, and is expelled to ambient air in step 120. Optionally, ambient air may then return to the entrance of the enclosure, repeating the process outlined in steps 100 to 120.

It should be recognized that embodiments of the invention may include both hardware aspects and software aspects. In particular, method embodiments may be implemented in software, which includes but is not limited to firmware, resident software and microcode. Furthermore, the invention can take the form of a computer program product accessible from a computer-readable medium providing program code for use by or in connection with a computer or any instruction execution system. For the purposes of this description, a computer-usable or computer readable medium can be any apparatus that can contain, store, communicate, propagate or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 8:
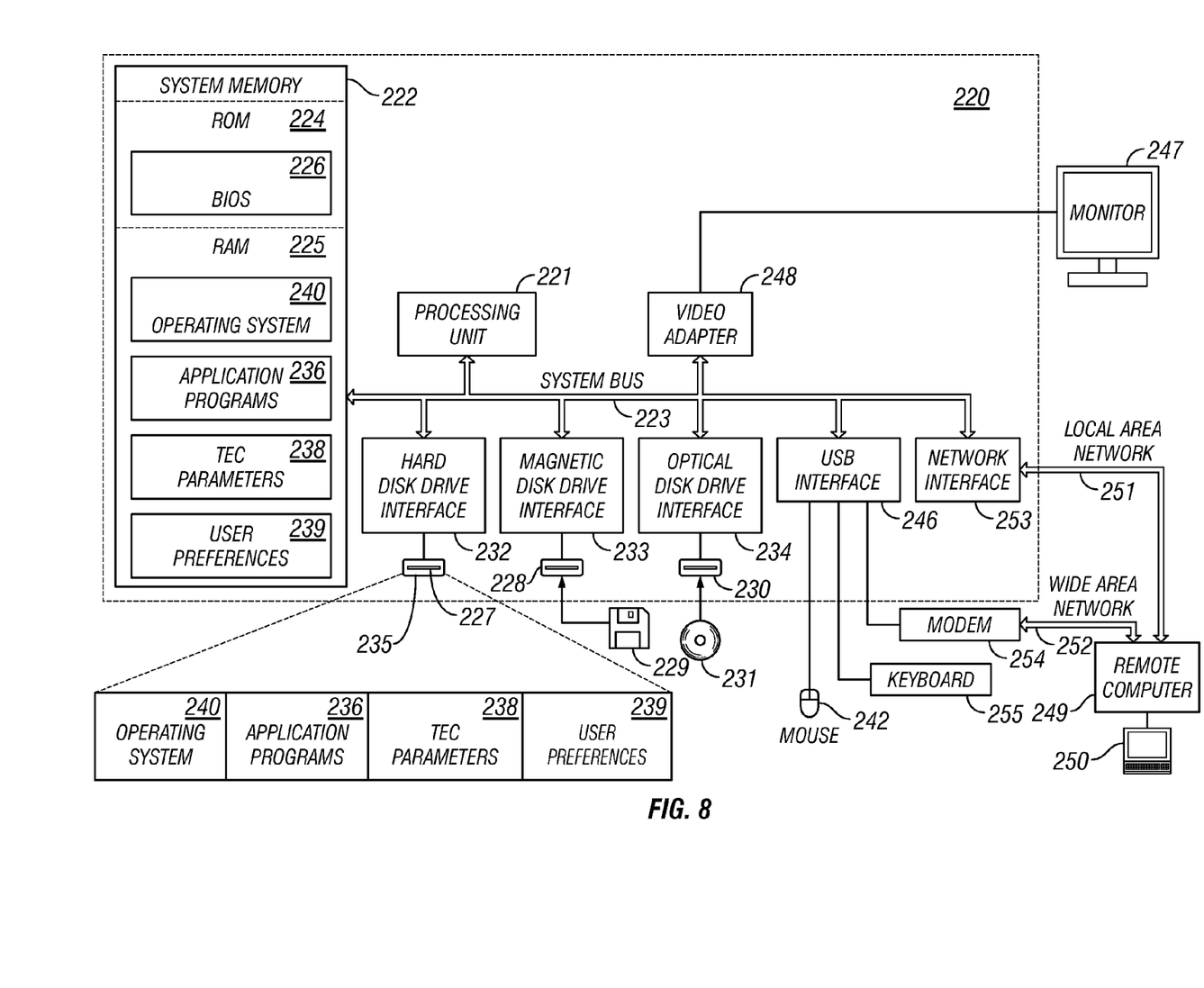
FIG. 8 is a schematic diagram of a computer system that may be configured, according to an embodiment of the invention, for operating a cooling system, to selectively cool air within a computer system.

To illustrate, FIG. 8 is a schematic diagram of a computer system generally indicated at 220 that may be configured, according to an embodiment of the invention, for operating a cooling system to selectively cool air within a rack system. The computer system 220 may be a general-purpose computing device in the form of a conventional computer system 220. Generally, computer system 220 includes a processing unit 221, a system memory 222, and a system bus 223 that couples various system components, including the system memory 222 to processing unit 221. System bus 223 may be any of several types of bus structures including a memory bus or memory controller, a peripheral bus, and a local bus using any of a variety of bus architectures. The system memory includes a read only memory (ROM) 224 and random access memory (RAM) 225. A basic input/output system (BIOS) 226, containing the basic routines that help to transfer information between elements within computer system 220, such as during start-up, is stored in ROM 224.

Computer system 220 further includes a hard disk drive 235 for reading from and writing to a hard disk 227, a magnetic disk drive 228 for reading from or writing to a removable magnetic disk 229, and an optical disk drive 230 for reading from or writing to a removable optical disk 231 such as a CD-R, CD-RW, DV-R, or DV-RW. Hard disk drive 235, magnetic disk drive 228, and optical disk drive 230 are connected to system bus 223 by a hard disk drive interface 232, a magnetic disk drive interface 233, and an optical disk drive interface 234, respectively. Although the exemplary environment described herein employs hard disk 227, removable magnetic disk 229, and removable optical disk 231, it should be appreciated by those skilled in the art that other types of computer readable media which can store data that is accessible by a computer, such as magnetic cassettes, flash memory cards, digital video disks, Bernoulli cartridges, RAMs, ROMs, USB Drives, and the like, may also be used in the exemplary operating environment. The drives and their associated computer readable media provide nonvolatile storage of computer-executable instructions, data structures, program modules, and other data for computer system 220. For example, the operating system 240 and application programs 236 may be stored in the RAM 225 and/or hard disk 227 of the computer system 220.

A user may enter commands and information into computer system 220 through input devices, such as a keyboard 255 and a mouse 242. One or more temperature sensors, such as the temperature sensor 66 of FIG. 4, may provide temperature input to the computer system 220. Other input devices (not shown) may include a microphone, joystick, game pad, touch pad, satellite dish, scanner, or the like. These and other input devices may be connected to processing unit 222 through a USB (universal serial bus) 246 that is coupled to the system bus 223, but may be connected by other interfaces, such as a serial port interface, a parallel port, game port, a Bluetooth transceiver, or the like. A display device 247 may also be connected to system bus 223 via an interface, such as a video adapter 248. In addition to the monitor, personal computers typically include other peripheral output devices (not shown), such as speakers and printers.

The computer system 220 may operate in a networked environment using logical connections to one or more remote computers 249. Remote computer 249 may be another personal computer, a server, a client, a router, a network PC, a peer device, a mainframe, a personal digital assistant, an internet-connected mobile telephone or other common network node. While a remote computer 249 typically includes many or all of the elements described above relative to the computer system 220, only a memory storage device 250 has been illustrated in FIG. 8. The logical connections depicted in the figure include a local area network (LAN) 251 and a wide area network (WAN) 252. Such networking environments are commonplace in offices, enterprise-wide computer networks, intranets, and the internet.

When used in a LAN networking environment, the computer system 220 is often connected to the local area network 251 through a network interface or adapter 253. When used in a WAN networking environment, the computer system 220 typically includes a modem 254 or other means for establishing high-speed communications over WAN 252, such as the internet. Modem 254, which may be internal or external, is connected to system bus 223 via USB interface 246. In a networked environment, program modules depicted relative to computer system 220, or portions thereof, may be stored in the remote memory storage device 250. It will be appreciated that the network connections shown are exemplary and other means of establishing a communications link between the computers may be used.

Program modules may be stored on hard disk 227, optical disk 231, ROM 224, RAM 225, or even magnetic disk 229. The program modules may include portions of an operating system 240, application programs 236, or the like. A TEC database 238 may be included, which may contain parameters and procedures for controlling a thermoelectric cooling module such as the TEC 56 of FIG. 4. For example, the TEC database may include a predetermined set of voltage and temperature parameters, for controlling voltage to the TEC 56 as a function of temperatures sensed by the temperature sensor 66. A user preferences database 239 may also be included, which may contain parameters and procedures established by the user for governing specific applications. These parameters and procedures may include information about the specific rack system to be cooled, so that the TEC 56 can provide the proper degree of cooling for a specific application. Such information may include the number and type of server blades installed, the type of enclosure, ambient conditions other than those sensed by temperature sensors and other sensors in the cooling system, and so forth. The user may input this information using the various input devices described above.

Aspects of the present invention may be implemented in the form of application program 236. Application program 236 may be informed by or otherwise associated with the TEC database 238 and/or the user preferences database 239. The application program 236 generally comprises computer-executable instructions for controlling the TEC 56 (FIG. 4) and other features of the cooling system 50. For example, the application program can control the voltage regulator 64 to selectively apply a voltage to the TEC 56 according to the level of desired cooling. The software may concurrently control a plurality of TECs. The software may control the TECs for example, according to temperatures supplied to the computer system 220 by the temperature sensor 66.

Embodiments of the invention, such as those described above, may efficiently and intelligently cool subsystems of electronic equipment. Subsystems may be selectively cooled as required, such as by extracting heat from airstreams that supply more temperature-sensitive components and transferring the extracted heat to components that are less sensitive to temperature. The use of TECs may desirably eliminate moving parts found in conventional cooling systems, such as fan blades coupled to heat sinks. Thus, a more reliable, solid-state rack system may be achieved according to the invention. Component cooling may be largely automated by using a voltage regulator to selectively control the degree of cooling provided by the TECs. Equipment may also be cooled more efficiently, by selectively expending energy to cool components according to their degree of temperature-sensitivity, and by correspondingly reducing cooling power where less needed. These and other advantages will be apparent to one of ordinary skill in the art having benefit of this disclosure. However, none of these advantages are necessarily intended in a limiting sense.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A cooling system for electronic equipment, comprising:
an enclosure housing a plurality of heat-generating electronic components, the enclosure having an enclosure inlet for receiving air and an enclosure outlet for exhausting heated air;
a first air pathway and a second air pathway separated by a distance within the enclosure;
a thermoelectric cooling module configured such that a first side is cooled and a second side is heated in response to an applied voltage;
a first heat exchanger disposed in the first air pathway and in thermal contact with the first side of the thermoelectric cooling module;
a second heat exchanger disposed in the second air pathway and in thermal contact with the second side of the thermoelectric cooling module;
a temperature sensor disposed within the enclosure and in electrical communication with a voltage regulator; and
wherein the voltage regulator is configured for varying the voltage to the thermoelectric cooling module in response to temperature sensed by the temperature sensor.

2. The system of claim 1, wherein the first air pathway is in fluid communication with an electronic subsystem to be cooled.

3. The system of claim 2, further comprising a blower having an inlet in fluid communication with the second air pathway and an outlet in fluid communication with the enclosure outlet.

4. The system of claim 1, wherein the second side of the thermoelectric cooling module is disposed within the second air pathway.

5. The system of claim 1, further comprising a first plenum defining the first air pathway and a second plenum defining the second air pathway.

6. A cooling system for electronic equipment, comprising:
an enclosure housing a plurality of heat-generating electronic components, the enclosure having an enclosure inlet for receiving air and an enclosure outlet for exhausting heated air;

a first air pathway and a second air pathway separated by a distance within the enclosure;

a thermoelectric cooling module configured such that a first side is cooled and a second side is heated in response to an applied voltage;

a first heat exchanger disposed in the first air pathway and in thermal contact with the first side of the thermoelectric cooling module;

a second heat exchanger disposed in the second air pathway and in thermal contact with the second side of the thermoelectric cooling module;

a controller in electrical communication with the thermoelectric cooling module; and a machine-accessible medium in communication with the controller and containing instructions, which when executed by the controller, cause the controller to apply a voltage to the thermoelectric cooling module to cool the first side and heat the second side of the thermoelectric cooling module.

7. The cooling system of claim 6, further comprising:
one or more temperature sensors in electrical communication with the controller; and
wherein the controller applies the voltage in response to a temperature sensed by the temperature sensor.

8. The cooling system of claim 7, wherein the controller applies the voltage as a function of a differential between the sensed temperature and the critical temperature.

9. The cooling system of claim 6, wherein the controller selectively increases the voltage in response to an increase in the sensed temperature.

10. A cooling system for electronic equipment, comprising:
an enclosure housing a plurality of heat-generating electronic components, the enclosure having an enclosure inlet for receiving air and an enclosure outlet for exhausting heated air;
a first air pathway and a second air pathway separated by a distance within the enclosure;
a thermoelectric cooling module configured such that a first side is cooled and a second side is heated in response to an applied voltage;
a first heat exchanger disposed in the first air pathway and in thermal contact with the first side of the thermoelectric cooling module, the first heat exchanger including a first heat sink spaced from the thermoelectric cooling module and one or more heat pipes extending between the first heat sink and the first side of the thermoelectric cooling module; and
a second heat exchanger disposed in the second air pathway and in thermal contact with the second side of the thermoelectric cooling module.

11. The system of claim 10, wherein the first air pathway is in fluid communication with an electronic subsystem to be cooled.

12. The system of claim 10, further comprising a blower having an inlet in fluid communication with the second air pathway and an outlet in fluid communication with the enclosure outlet.

13. The system of claim 10, further comprising a voltage regulator in electrical communication with the thermoelectric cooling module for controlling the applied voltage.

14. The system of claim 10, wherein the second side of the thermoelectric cooling module is disposed within the second air pathway.

15. A cooling system for electronic equipment, comprising:
an enclosure housing a plurality of heat-generating electronic components, the enclosure having an enclosure inlet for receiving air and an enclosure outlet for exhausting heated air;
a first air pathway and a second air pathway separated by a distance within the enclosure;
a thermoelectric cooling module configured such that a first side is cooled and a second side is heated in response to an applied voltage;
a first heat exchanger disposed in the first air pathway and in thermal contact with the first side of the thermoelectric cooling module; and
a second heat exchanger disposed in the second air pathway and in thermal contact with the second side of the thermoelectric cooling module, wherein the second heat exchanger includes a second heat sink spaced from the thermoelectric cooling module and one or more heat pipes extending between the second heat sink and the second side of the thermoelectric cooling module.

16. The system of claim 15, wherein the first air pathway is in fluid communication with an electronic subsystem to be cooled.

17. The system of claim 15, further comprising a blower having an inlet in fluid communication with the second air pathway and an outlet in fluid communication with the enclosure outlet.

18. The system of claim 15, further comprising a voltage regulator in electrical communication with the thermoelectric cooling module for controlling the applied voltage.

19. The system of claim 15, wherein the second side of the thermoelectric cooling module is disposed within the second air pathway.

* * * * *